United States Patent
Botman et al.

(10) Patent No.: US 9,951,417 B2
(45) Date of Patent: *Apr. 24, 2018

(54) METHOD OF DEPOSITING MATERIAL

(71) Applicant: FEI Company, Hillsboro, OR (US)

(72) Inventors: Aurélien Philippe Jean Maclou Botman, Portland, OR (US); Steven Randolph, Portland, OR (US); Milos Toth, Sydney (AU)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/507,540

(22) Filed: Oct. 6, 2014

(65) Prior Publication Data

US 2015/0099071 A1   Apr. 9, 2015

Related U.S. Application Data

(63) Continuation of application No. 13/017,015, filed on Jan. 30, 2011, now Pat. No. 8,853,078.

(51) Int. Cl.
| | |
|---|---|
| *C23C 16/02* | (2006.01) |
| *C23C 16/10* | (2006.01) |
| *C23C 16/14* | (2006.01) |
| *C23C 16/48* | (2006.01) |
| *C23C 16/448* | (2006.01) |
| *C23C 16/52* | (2006.01) |

(52) U.S. Cl.
CPC .......... *C23C 16/0263* (2013.01); *C23C 16/10* (2013.01); *C23C 16/14* (2013.01); *C23C 16/4488* (2013.01); *C23C 16/48* (2013.01); *C23C 16/486* (2013.01); *C23C 16/52* (2013.01)

(58) Field of Classification Search
CPC .......... H01L 21/0262; H01L 21/02636; C23C 16/0263; C23C 16/10; C23C 16/14
See application file for complete search history.

(56) References Cited

U.S. PATENT DOCUMENTS

| | | | |
|---|---|---|---|
| 4,239,788 A | 12/1980 | Beck | |
| 5,135,695 A | 8/1992 | Marcus | |
| 5,156,827 A * | 10/1992 | Tom | B01J 8/0278 252/188.1 |
| 6,399,944 B1 | 6/2002 | Vasilyev et al. | |

(Continued)

FOREIGN PATENT DOCUMENTS

| | | |
|---|---|---|
| JP | 62290874 A | 12/1987 |
| JP | 0437029 A | 2/1992 |

(Continued)

OTHER PUBLICATIONS

Botman, A., et al., "Creating Pure Nanostructures from Electron-Beam-Induced Deposition Using Purification Techniques: A Technology Perspective," Nanotechnology, Aug. 26, 2009, 17 pages, vol. 20.

(Continued)

*Primary Examiner* — Julia Slutsker
(74) *Attorney, Agent, or Firm* — Scheinberg & Associates, P.C.; John E. Hillert

(57) ABSTRACT

Material is deposited in a desired pattern by spontaneous deposition of precursor gas at regions of a surface that are prepared using a beam to provide conditions to support the initiation of the spontaneous reaction. Once the reaction is initiated, it continues in the absence of the beam at the regions of the surface at which the reaction was initiated.

21 Claims, 6 Drawing Sheets

(56) References Cited

U.S. PATENT DOCUMENTS

| | | | |
|---|---|---|---|
| 7,504,182 | B2 | 3/2009 | Stewart et al. |
| 7,674,706 | B2 | 3/2010 | Gu et al. |
| 7,807,062 | B2 | 10/2010 | Williamson et al. |
| 8,268,532 | B2 | 9/2012 | Jong et al. |
| 2006/0045987 | A1 | 3/2006 | Chandler et al. |
| 2007/0104888 | A1* | 5/2007 | Mazen .................. B82Y 30/00 427/533 |
| 2008/0090402 | A1 | 4/2008 | Bonilla et al. |
| 2008/0142735 | A1 | 6/2008 | Chandler et al. |
| 2010/0032567 | A1 | 2/2010 | Maclou Botman et al. |
| 2010/0197142 | A1 | 8/2010 | Randolph et al. |
| 2010/0224592 | A1 | 9/2010 | Toth et al. |
| 2010/0276607 | A1 | 11/2010 | Wanzenboeck et al. |
| 2011/0031655 | A1 | 2/2011 | Toth et al. |
| 2011/0070381 | A1 | 3/2011 | Toth et al. |
| 2011/0114665 | A1 | 5/2011 | Chandler et al. |
| 2011/0115129 | A1 | 5/2011 | Straw et al. |
| 2011/0210181 | A1 | 9/2011 | Edinger et al. |
| 2012/0003394 | A1 | 1/2012 | Mulders et al. |

FOREIGN PATENT DOCUMENTS

| | | | |
|---|---|---|---|
| JP | 0437133 | A | 2/1992 |
| JP | 0964030 | A | 3/1997 |
| JP | 2008231473 | A | 10/2008 |
| WO | 8911553 | | 11/1989 |
| WO | 9738355 | | 10/1997 |
| WO | WO2000065611 | A1 | 11/2000 |
| WO | WO-2008/098084 | * | 8/2008 ............. H01J 37/28 |

OTHER PUBLICATIONS

Van Dorp, W.F., et al., "A Critical Literature review of Focused Electron Beam Induced Deposition," Journal of Applied Physics, 2008, pp. 081301-1 to 081301-42, vol. 104.

Folch, Albert, et al., "Electron Beam Deposition of Gold Nanostructures in a Reactive Environment," Appl. Phys. Lett., Apr. 17, 1995, pp. 2080-2082, vol. 66., No. 16.

Molhave, Kristian, et al., "Solid Gold Nanostructures Fabricated by Electron Beam Deposition," Nanoletters, 2003, pp. 1499-1503, vol. 3, No. 11.

Randolph, S. J., et al., "Focused, Nanoscale Electron-Beam-Induced Deposition and Etching," Critical Reviews in Solid State and Materials Sciences, 2006, pp. 55-89, vol. 31.

Thurier, Cyril, et al., "Platinum OMCVD Processes and Precursor Chemistry," 2008, pp. 155-169, vol. 252.

Utke, Ivo, et al., "Gas-assisted focused electron beam and ion beam processing and fabrication," Journal of Vacuum Science and Technology Part B, Aug. 11, 2008, pp. 1197-1276, vol. 26, No. 4.

Wang, S. et al., "Electron-beam induced initial growth of platinum films using Pt(PF3)4," Journal of Vacuum Science & Technology B: Microelectronics Processing and Phenomena, Jul. 23, 2004, pp. 1803-1806, vol. 22, No. 4.

Cicoira, F., et al., "Electron beam induced deposition of rhodium from the precursor [RhCl(PF3)2]2: morphology, structure and chemical composition," Journal of Crystal Growth, 2004, vol. 265, pp. 619-626.

Yasuda, T., et al., "Chemical vapor disposition of Si on chlorosilane-treated SiO2 surfaces. II. Selective deposition in the regions defined by electron-beam irradiation," Journal of Applied Physics, 2001, vol. 90, No. 8.

Matsui, Shinji, et al., "New Selective Deposition Technology by Electron Beam Induced Surface Reaction," Journal of Japanese Applied Physics, vol. 23, No. 9, 1984, pp. L706-L708, Kawasaki.

Tanaka, M. et al., "The size dependence of the nano-dots formed by electron-beam-induced deposition on the partial pressure of the precursor," Applied Physics A, vol. 78, pp. 543-546. 2004, Japan.

Yan, H. Q., et al, "Low Energy Beam Assisted Deposition of Low Resistivity Aluminum Using TMAA," Mat. Res. Soc. Symp. Prac. vol. 316, pp. 863-868, 1994.

\* cited by examiner

METHOD OF DEPOSITING MATERIAL

This application is a continuation of U.S. patent application Ser. No. 13/017,015, filed Jan. 30, 2011, which is incorporated by reference herein.

TECHNICAL FIELD OF THE INVENTION

The present invention relates to a method and apparatus for depositing material in a pattern that includes features on a microscopic or nanoscopic scale.

BACKGROUND OF THE INVENTION

Beam systems, such as electron beam systems, ion beam systems, laser beam systems, cluster beam systems, and neutral particle beam systems, are used to create features on a surface by etching or depositing material. Beam-induced deposition processes typically use a precursor gas that reacts in the presence of the beam to deposit material on the surface in areas where the beam impacts. For example, a gaseous organometallic compound, such as tungsten hexcarbonyl, is provided near the sample and is adsorbed onto the surface. The organometallic compound decomposes in the presence of a beam, such as an ion beam or an electron beam, to form a metal that remains on the surface and a volatile organic compound that is removed by a vacuum pump. Because the precursor is stable, that is, it does not spontaneously decompose on the surface in the absence of the beam, a fine structure can be deposited, with the feature size of the structure determined by the beam size and the beam-sample interaction volume.

Two disadvantages of charged particle beam-induced deposition are low deposition rates and carbon contamination of the deposit. While charged particle beams can typically be made much smaller than a laser beam, the size of the beam spot on the work piece, is typically inversely proportional to the current in the beam. A small, high resolution beam, therefore, has a low current, which produces a low deposition rate. The rate of electron beam-induced deposition is typically between about $5\times10^{-4}$ $um^3 \cdot nC^{-1}$ to about $5\times10^{-3}$ $um^3 \cdot nC^{-1}$.

Precursor gases for charged particle beam deposition are typically carbon containing metallo-organic compounds. Carbon from the precursors, or from other sources such as lubricants in the vacuum chamber, typically contaminates the deposited metallic material, greatly increasing the resistivity of the deposit. The slow deposition rate and the high resistivity are undesirable for nanoprototyping and nanoresearch applications.

Various techniques have been tried to improve the purity of beam-induced deposits, but have met with limited success. Such techniques include heating the work piece during deposition, annealing the deposit after deposition, mixing the precursor gas with reactive gases during or after deposition, and using carbon-free precursors. An over view of techniques used to deposit a pure material is provided in A. Botman, et al., "Creating pure nanostructures from electron-beam-induced deposition using purification techniques: a technology perspective," *Nanotechnology* 20 372001 (2009).

Pure deposits have been achieved in electron beam-induced deposition in ultra high vacuum systems, but such systems significantly increase cost and the deposit rate is still low. Contamination reduction has also been achieved in electron or ion beam-induced deposition by mixing a deposition precursor with an oxidizer such as $O_2$ or $H_2O$, as described, for example, in Folch et al, *Appl Phys. Lett.* 66, 2080-2082 (1995) and Molhave et al, *Nano Lett.* 3, 1499-1503 (2003)). Use of an oxidizer is often undesirable because it results in oxide formation or incomplete reduction of the precursor gas.

Attempts to use hydrogen gas to improve the purity and deposition rate of iron deposited from $Fe(CO)_5$ have been unsuccessful, perhaps because of the low sticking coefficient and/or short residence times on common surfaces; H. Wanzenboeck et al, presented at International Conference on Electron, Ion, and Photon Beam Technology and Nanofabrication (EIPBN) 2008. The current state of the art of electron beam-induced deposition is described, for example, in Randolph et al, "Focused Nanoscale Electron-Beam-Induced Deposition and Etching," *Critical Reviews in Solid State and Materials Sciences*, 31:55-89 (2006).

SUMMARY OF THE INVENTION

An object of the invention is to provide an improved deposition process.

Deposition of a localized pattern is achieved, for example, by producing local conditions conducive to a spontaneous deposition reaction in the desired pattern, while global conditions on the work piece are not conducive to the spontaneous reaction. In accordance with some preferred embodiments, the spontaneous decomposition reaction can deposit a relatively pure material in a microscopic or nanoscopic scale pattern. Unlike prior art beam deposition processes in which the beam is required to sustain the reaction, in embodiments of the present invention, the beam produces local conditions that are conducive to the initiation of a spontaneous reaction that continues after the beam ceases.

In some embodiments, a beam is directed toward a work piece to prepare a work piece surface so that the work piece includes portions that support the initiation of a spontaneous deposition reaction and portions that do not support the initiation of the spontaneous deposition reaction. Multiple gases, typically including a precursor gas and an activator gas, are provided at the work piece surface, the gases spontaneously reacting with each other to deposit a material at the regions at the surface that support the initiation of the spontaneous deposition reaction without depositing material at the portions of the work piece that do not support the initiation of the spontaneous deposition reaction, to selectively deposit material in a pattern onto the work piece surface.

In some embodiments, the products of the spontaneous reaction between the precursor gas and activator gas can include a compound which upon interaction with the substrate or work piece material causes an etching reaction instead of a deposition. As a result, some amount of the substrate, sample or work piece is chemically removed.

In some embodiments, the global reaction is suppressed by elevating the work piece temperature globally, which reduces the adsorption of the reactants across the work piece. A local reaction induced by an electron beam provides a nucleation site that locally lowers the reaction barrier and the initial deposit then acts like a catalyst for the subsequent reaction. In another embodiment, the surface is locally modified, for example, by impact of an ion beam, and the reaction is initiated only on the modified surface.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
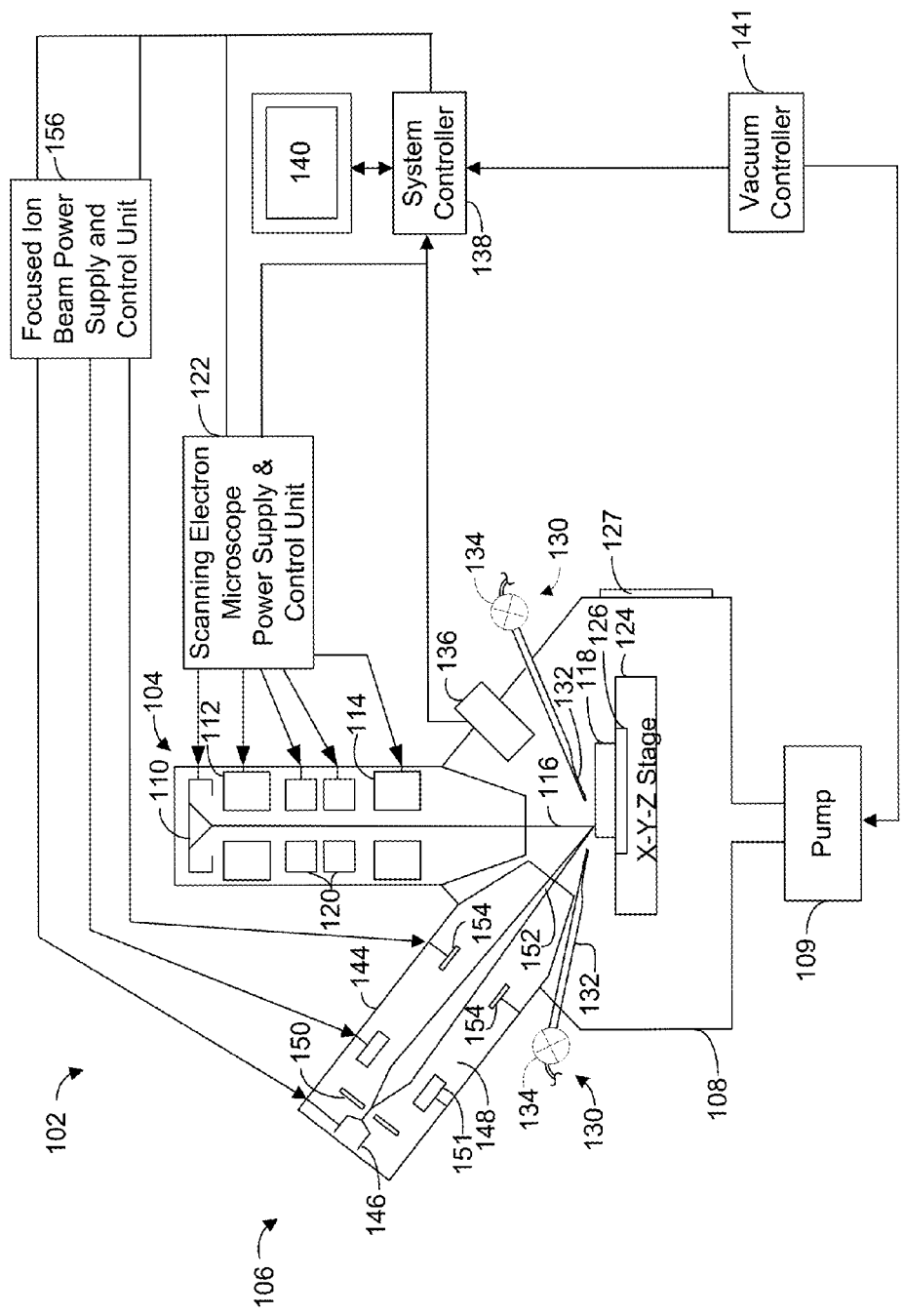
FIG. 1 shows a charged particle beam system that can be used to implement the present invention.

In accordance with a preferred embodiment of the present invention, a spontaneous decomposition reaction involving two or more species results in rapid deposition of a high purity material. Some embodiments mix two chemicals, a precursor and an activator, that react spontaneously and would therefore have been considered incompatible in the prior art. In some embodiments, the reactants react spontaneously to fully decompose a metal-containing reactant to deposit an essentially pure metal onto the substrate, sample or work piece. In other embodiments, the reaction causes etching of the substrate, sample or work piece.

Embodiments of the invention deposit material in a pattern by providing local conditions in the desired pattern to enable the spontaneous decomposition reaction, while maintaining conditions that inhibit the reaction on the rest of the work piece surface. The reaction may be inhibited globally, for example, by decreasing the surface residence time of the species, which can be achieved by increasing the work piece temperature, or by providing a material on the surface that inhibits the reaction. A deposition pattern may be defined locally, for example, by creating initial seeds or nucleation sites in the desired pattern on the work piece, for example, by a beam, such as a photon beam (e.g., a laser beam) or a charged particle beam to impinge on the surface in the desired pattern. The beam is thought to enable the local deposition by altering the surface, such as by removing contamination, removing a native oxide layer, creating surface features that act as nucleation sites or providing additional energy.

The global conditions at the work piece surface are sufficiently close to the conditions required to support the reaction so that once the reaction has been initiated, the reaction can continue in the absence of the beam until at least one of the reactants is no longer available in sufficient quantity to sustain the reaction. The initial deposit acts as a catalyst for subsequent reactions to continue the deposition. In many embodiments, the beam does not include material that is deposited onto the surface to catalyze the reaction; instead the beam itself acts as the catalyst, alters the surface or provides energy to initiate the reaction.

Some embodiments of the invention are essentially a form of low temperature chemical vapor deposition (CVD) in which a precursor adsorbate is decomposed by an activator chemical leading to rapid growth of a pure material. Some embodiments work well with the reaction being initiated at room temperature; some embodiments were tested and worked at temperatures elevated by several tens of degrees. In some embodiments, the work piece is maintained at a temperature below the temperature of the walls of the vacuum chamber to cause the gases to preferentially react on the surface of the portion of the work piece. For example, in some embodiments the deposition is initiated while the work piece surface is maintained at a temperature of less than or about 200° C., less than or about 100° C., or less than or about 60°. In preferred embodiments of the invention, applicants believe that the deposition reaction takes place only at the sample surface, not in the gas, and takes place only when the concentrations of both precursor species are within a "growth window." To localize the deposition process the growth window can be broadened locally, such as by electron, ion, or laser irradiation, so that the local conditions at the sample are within the broadened growth window. The growth window is dependent on conditions at the sample surface, such as surface composition and morphology, that is, shape, structure, and texture.

The deposition rate varies with the embodiment and can vary, for example, depending on the relative and absolute abundance of the precursor and activation chemicals, the work piece temperature, the method of nucleation, and other factors. The deposition rate is typically independent of the charged particle beam current or laser beam fluence used to initiate the reaction.

FIG. 1 depicts an exemplary dual beam system 102 that can be used to carry out embodiments of the invention. Suitable dual beam systems are commercially available, for example, from FEI Company, Hillsboro, Oreg., the assignee of the present invention. While an example of suitable hardware is provided below, the invention is not limited to being implemented in any particular type of hardware.

Dual beam system 102 has a vertically mounted electron beam column 104 and a focused ion beam (FIB) column 106 mounted at an angle of approximately 52 degrees from the vertical on an evacuable specimen chamber 108. The specimen chamber may be evacuated by pump system 109, which typically includes one or more, or a combination of, a turbo-molecular pump, oil diffusion pumps, ion getter pumps, scroll pumps, or other known pumping means.

The electron beam column 104 includes an electron source 110, such as a Schottky emitter or a cold field emitter, for producing electrons, and electron-optical lenses 112 and 114 forming a finely focused beam of electrons 116. Electron source 110 is typically maintained at an electrical potential of between 500 V and 30 kV above the electrical potential of a work piece 118, which is typically maintained at ground potential.

Thus, electrons impact the work piece 118 at landing energies of approximately 500 eV to 30 keV. A negative electrical potential can be applied to the work piece to reduce the landing energy of the electrons, which reduces the interaction volume of the electrons with the work piece surface, thereby reducing the size of the nucleation site. Work piece 118 may comprise, for example, a semiconductor device, microelectromechanical system (MEMS), or a lithography mask. The impact point of the beam of electrons 116 can be positioned on and scanned over the surface of a work piece 118 by means of deflection coils 120. Operation of lenses 112 and 114 and deflection coils 120 is controlled by scanning electron microscope power supply and control unit 122. Lenses and deflection unit may use electric fields, magnetic fields, or a combination thereof.

Work piece 118 is on movable stage 124 within specimen chamber 108. Stage 124 can preferably move in a horizontal plane (X and Y axes) and vertically (Z axis) and can tilt approximately sixty (60) degrees and rotate about the Z axis. A door 127 can be opened for inserting work piece 118 onto X-Y-Z stage 124 and also for servicing an internal gas supply reservoir (not shown), if one is used. The door is interlocked so that it cannot be opened if specimen chamber 108 is evacuated. Stage 124 may be cooled, for example, by a Peltier cooler (not shown) or heated by, for example, a resistive heater 126.

Mounted on the vacuum chamber are multiple gas injection systems (GIS) 130 (two shown). Each GIS comprises a reservoir (not shown) for holding the precursor or activation materials and a needle 132 for directing the gas to the surface of the work piece. Each GIS further comprises means 134 for regulating the supply of precursor material to the work piece. In this example the regulating means are depicted as an adjustable valve, but the regulating means could also comprise, for example, a regulated heater for heating the precursor material to control its vapor pressure.

When the electrons in the electron beam 116 strike work piece 118, secondary electrons, backscattered electrons, and Auger electrons are emitted and can be detected to form an image or to determine information about the work piece. Secondary electrons, for example, are detected by secondary electron detector 136, such as an Everhard-Thornley detector, or a semiconductor detector device capable of detecting low energy electrons. Signals from the detector 136 are provided to a system controller 138 that controls a monitor 140, which is used to display user controls and an image of the work piece using the signal from detector 136.

The chamber 108 is evacuated by pump system 109 under the control of vacuum controller 141. The vacuum system provides within chamber 108 a vacuum of approximately $3 \times 10^{-6}$ mbar. When a suitable precursor or activator gas is introduced onto the sample surface, the chamber background pressure may rise, typically to about $5 \times 10^{-5}$ mbar. The local pressure and gas concentration at the work piece surface are significantly greater than the background pressure and concentration. See, for example, Randolph et al. above, which determines the local pressure at a work piece surface.

Focused ion beam column 106 comprises an upper neck portion 144 within which are located an ion source 146 and a focusing column 148 including extractor electrode 150 and an electrostatic optical system including an objective lens 151. Ion source 146 may comprise a liquid metal gallium ion source, a plasma ion source, a liquid metal alloy source, or any other type of ion source. The axis of focusing column 148 is tilted 52 degrees from the axis of the electron column. An ion beam 152 passes from ion source 146 through focusing column 148 and between electrostatic deflectors 154 toward work piece 118.

FIB power supply and control unit 156 provides an electrical potential at ion source 146. Ion source 146 is typically maintained at an electrical potential of between 1 kV and 60 kV above the electrical potential of the work piece, which is typically maintained at ground potential. Thus, ions impact the work piece at landing energies of approximately 1 keV to 60 keV. FIB power supply and control unit 156 is coupled to deflection plates 154 which can cause the ion beam to trace out a corresponding pattern on the upper surface of work piece 118. In some systems, the deflection plates are placed before the final lens, as is well known in the art. Beam blanking electrodes (not shown) within ion beam focusing column 148 cause ion beam 152 to impact onto blanking aperture (not shown) instead of work piece 118 when a FIB power supply and control unit 156 applies a blanking voltage to the blanking electrode.

The ion source 146 typically provides a beam of singly charged positive gallium ions that can be focused into a sub one-tenth micrometer wide beam at work piece 118 for modifying the work piece 118 by ion milling, enhanced etch, material deposition, or for imaging the work piece 118.

System controller 138 controls the operations of the various parts of dual beam system 102. Through system controller 138, a user can cause ion beam 152 or electron beam 116 to be scanned in a desired manner through commands entered into a conventional user interface (not shown). Alternatively, system controller 138 may control dual beam system 102 in accordance with programmed instructions. FIG. 1 is a schematic representation, which does not include all the elements of a typical dual beam system and which does not reflect the actual appearance and size of, or the relationship between, all the elements.

Figure 2:
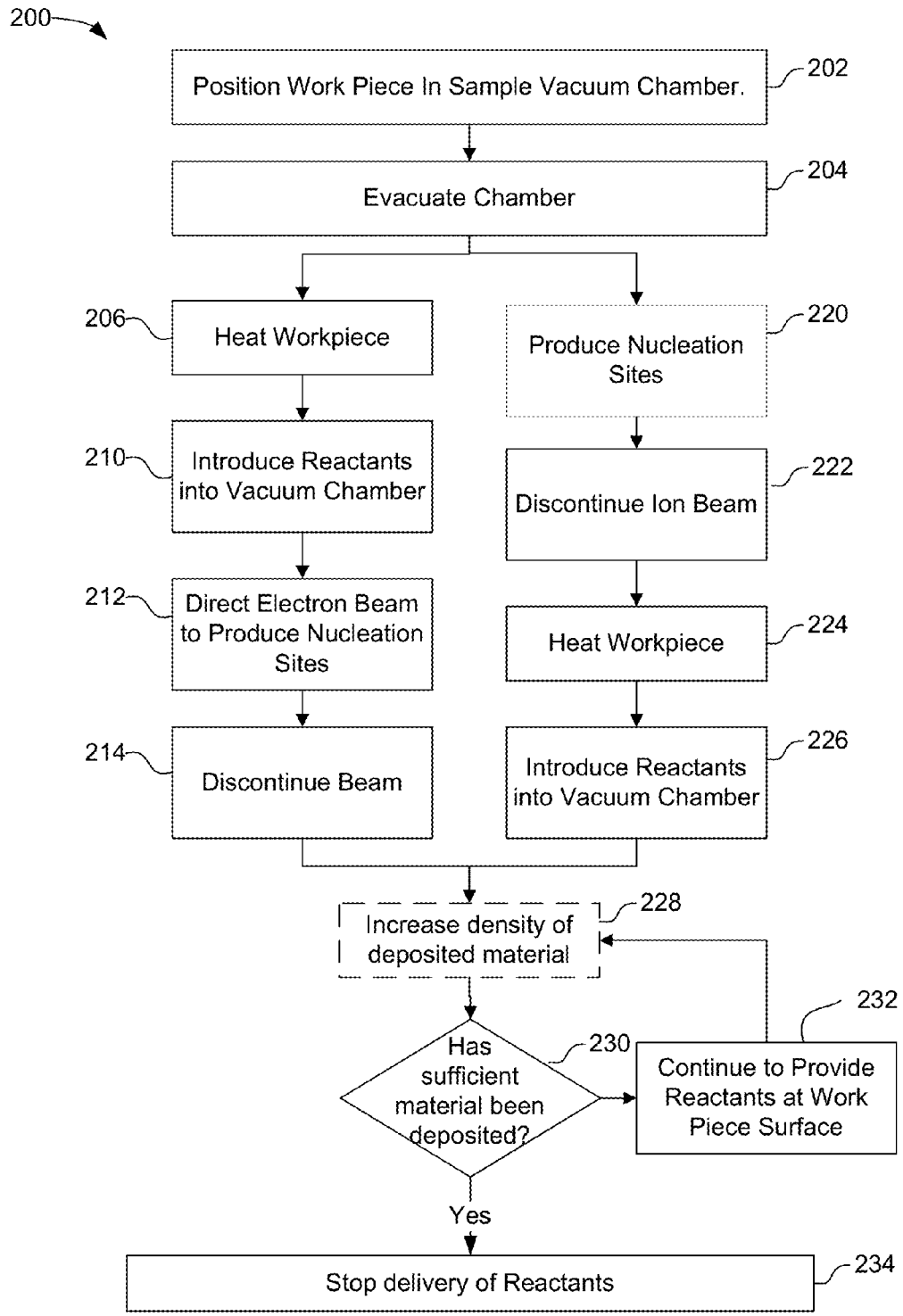
FIG. 2 is a flow chart showing the steps of an embodiment of the invention.

FIG. 2 shows a flowchart 200 describing the steps of one embodiment of the invention. Surface conditions favorable to the initiation of a deposition reaction are created in a desired pattern. In some embodiments, as shown in the right branch of the flow chart in FIG. 2, the pattern is created and then the reactants are introduced. In other embodiments, such as the one shown in the left branch, the pattern is created while the reactants are present at the surface.

In step 202, a work piece is positioned in a sample vacuum chamber. In step 204, the chamber is evacuated. In step 206, on the left branch, the work piece is optionally heated slightly above room temperature, for example, to about 60° C. The work piece preferably remains at a fixed temperature for the entire time that the reactants are in the chamber. Applicants believe that the reaction requires a sufficient quantity of each of the reactants, within a specified ratio range, adsorbed onto the surface for the reaction to initiate. Heating is thought to reduce the likelihood of a spontaneous reaction of the reactants by reducing the sticking coefficient of the reactants so that there is insufficient reactant on the surface to initiate the reaction without a beam-induced alteration of local conditions.

In step 210, the reactants are introduced into the sample vacuum chamber, for example, through separate gas injection system (GIS) needles. For deposition to occur, both gases should be present simultaneously at the sample, and the ratio of the gases should be controlled within a range. In one embodiment, $Pt(PF_3)_4$ gas is injected into the chamber through one GIS needle and $XeF_2$ is injected into the chamber through a second GIS needle. The partial pressures of $Pt(PF_3)_4$ and $XeF_2$ are between $1 \times 10^{-7}$ mbar and $1 \times 10^{-2}$ mbar. The ratio of $Pt(PF_3)_4$ pressure to $XeF_2$ pressure is preferably between 1:1000 and 1000:1.

Other gases that may be used as precursor gases include, for example, $Ni(PF_3)_4$, $Cr(PF_3)_6$, $Fe(PF_3)_5$. Other gases that may be used as the activator gas include $Cl_2$ and $F_2$. Preferred precursor gases such as metal-organic compounds, metal-organic compounds with carbonyl groups, inorganic compounds with metal ligands, or metal compounds with fluorophosphine groups preferably decompose completely to produce an essentially pure deposit and one or more volatile compounds. Other desirable properties of a precursor gas include a vapor pressure greater than the base pressure of the vacuum system, and a high degree of chemical stability in the absence of an activator gas.

Preferred activator gases such as halogen-containing compounds, or highly oxidizing or reducing agents preferably react with the precursor gas to decompose completely to produce a pure deposit and one or more volatile compounds. Other desirable properties of an activator gas include a vapor pressure greater than the base pressure of the vacuum system, and a high degree of chemical stability in the absence of a precursor gas. Such gases include $XeF_2$, $Cl_2$ or $F_2$.

In step 212, nucleation sites are produced that will induce the gases to react spontaneously at the sites. In one embodiment, an electron beam is directed toward the work piece while the reactant gases are present, the electron beam being directed in a pattern that corresponds to the desired deposition pattern. The electron beam is preferably used in spot mode with a long, single-pass dwell time on the order of milliseconds or seconds at each dwell point, to create a spot mode deposit. The gases begin to react spontaneously at the spot where the electron beam hits the work piece surface, creating a nucleation site. An ion beam, laser beam, or other type of beam could also be used in step 212. In step 214, the beam is discontinued after creation of the pattern of nucleation sites. The reaction will continue in the absence of the beam at the sites where nucleation occurred as long as reactants are present in adequate quantities, that is, at adequate concentrations or partial pressures to sustain the reaction, the reaction subsequently being catalyzed by previously deposited material.

In another embodiment, as shown in the right branch of the flow chart shown in FIG. 2, the nucleation sites are produced before the reactants are introduced. In step 220, nucleation sites are produced for example, by directing a beam of ions, such as gallium ions from a liquid metal ion source, in a pattern onto the surface of the work piece or by directing a beam of photons toward the work piece before providing multiple gases at the work piece surface. The ion beam is thought to affect the surface morphology by increasing the surface roughness, to create the nucleation sites. In step 222, the beam is discontinued and in step 224 the work piece is optionally heated. Alternately, the work piece may be heated while the nucleation sites are created. In step 226, the reactants are introduced into the vacuum chamber near the sample surface.

At this point in both branches, nucleation sites have been created and reactants are present at the surface. Applicants have found that the when the reactants are introduced into the vacuum chamber, they will initially spontaneously decompose at the nucleation sites. After the initial growth at the nucleation site, further spontaneous decomposition takes place on freshly-decomposed material, thereby causing overall growth to proceed radially outwards from each nucleation site.

In some experiments, applicants have found that the resistivity of the deposited platinum film was around 1000 $\mu\Omega$-cm. This resistivity is considerably higher than the bulk resistivity of pure platinum, which is about 10 $\mu\Omega$-cm. Applicants believe that the higher measured resistivity occurs because the deposited films included voids, that is, they were not fully dense. FIB cross sections made of some films support this hypothesis by showing voids in the deposited material. Applicants found that the resistivity of the deposited film can be significantly lowered by applying a focused ion beam to the film as it is being deposited to compress or "densify" the deposited material and reduce or eliminate voids.

In optional step 228, an ion beam, such as a beam of gallium ions from a liquid metal ion source or argon ions from a plasma ion source, is directed toward the work piece where the deposition is occurring to increase the density of the deposited material. The ion beam preferably irradiates the deposit in "flood mode," that is, with low magnification and the highest available current. Applicants have found that higher gallium ion current leads to better conductivity. Applicants interpret this result as showing that the impact of the gallium ions densifies the platinum film. Applicants have produced platinum films that have resistivities of about 60 $\mu\Omega$-cm using a 4.3 nA gallium ion beam current. Lower resistivities may potentially be attainable using higher beam currents. Using a noble gas to densify the deposit eliminates the implantation of gallium atoms, which may be desirable in some applications.

In decision block 230, it is determined whether sufficient material has been deposited. The amount of material deposited can be calculated by knowing the deposition rate and measuring the time that sufficient concentrations of reactants have been in the chamber, or by measuring a property of the coating, such as resistivity, that correlates to thickness. Another method of determining film thickness is described in U.S. Pat. No. 6,399,944 to Vasilyev, et al. for "Measurement of film thickness by inelastic electron scattering," which is assigned to the assignee of the present invention.

If sufficient material has not been deposited, then reactants are continued to be introduced to the work piece surface in step 232. If sufficient material has been deposited, the flow of reactants is stopped in step 234. For example, the delivery of $XeF_2$ can be rapidly stopped once the deposit has grown sufficiently. It will be understood that the ability to stop the reaction depends on the rate at which the gas is exhausted from the chamber by the chamber vacuum pump and the pressure of the reactant during processing.

Figure 3A:
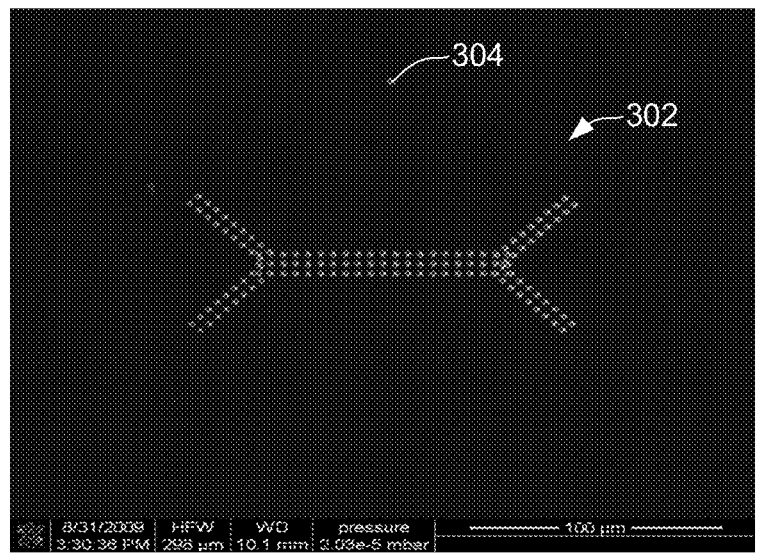
FIG. 3A is a photomicrograph of a pattern shortly after the deposition was initiated by an electron beam.
Figure 3B:
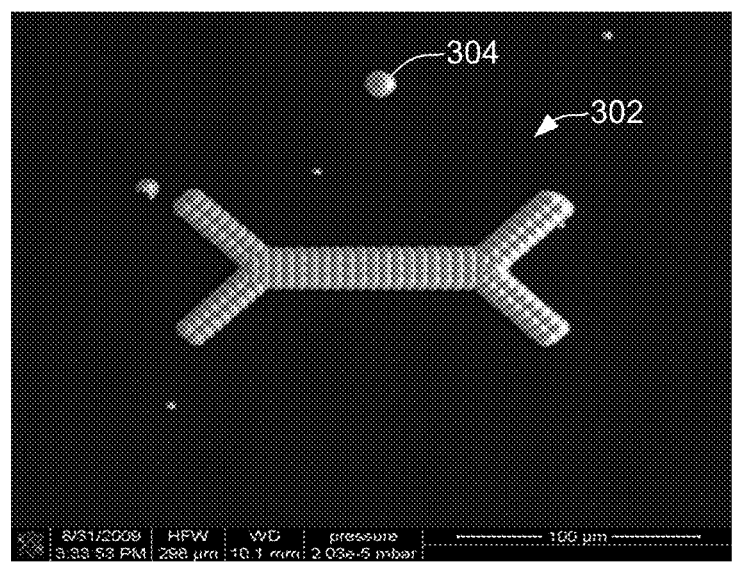
FIG. 3B is a photomicrograph of the deposit of FIG. 3A taken about one minute after the photomicrograph of FIG. 3A.

FIGS. 3A and 3B are photomicrographs of platinum deposits made in accordance with an embodiment of the present invention. FIG. 3A shows an image of a platinum pattern 302 taken shortly after the electron-beam induced seeding in accordance with the process in the left column of FIG. 2 using $Pt(PF_3)_4$ and $XeF_2$. FIG. 3B shows the same pattern 302 after letting the deposit grow spontaneously for about a minute in the absence of an electron beam. FIGS. 3A and 3B demonstrate how the final pattern is a direct result of the seeding performed by the electron beam. Random deposition at points such as point 304 is thought to be caused by preexisting surface defects that act as nucleation sites.

Unlike prior art electron beam-induced deposition, ion beam-induced deposition, and laser-induced deposition, in which the deposition occurs only in the presence of the beam, deposition in the present invention continues at each point that was "seeded" by the beam after the beam is discontinued. Thus deposition can be much faster, because material is being deposited simultaneously at every nucleation site, even after the beam has moved to the next site in the scan pattern. Thus, while a single beam can only impact a single dwell point at a time, deposition in the present invention can occur simultaneously and continuously at many points across the work piece surface.

The spontaneous reaction is thought to occur on the surface of the work piece after the gases are adsorbed, and not in the gas phase. The reaction rate is dependent on the work piece surface temperature and the relative and absolute abundance of both gases. In an embodiment using $Pt(PF_3)_4$ as the precursor gas and $XeF_2$ as the activator gas to deposit platinum, the deposition rate has been measured at fifty cubic microns per second and the material deposited has an energy dispersive x-ray analysis spectrum which is indistinguishable from that of pure platinum.

Applicants have found that some deposited films tend to delaminate and thicker films tend to crack. This may be further evidence of the deposited material's high purity. It is thought that the amount of delamination is also dependent on the adhesion of the film to the work piece. For example, adhesion of the metallic films to silicon appears to be substantially better than the adhesion of films to silicon dioxide. Growing the films more slowly is desirable to create high-density films and avoid cracking, although applicants have found that there appears to be a minimum growth rate for any particular set of conditions. Films grown at room temperature show a higher propensity to delamination than those grown at work piece temperatures of, for instance, 60° C., though cracking was observed for the latter also.

Embodiments of the present invention can be used in a wide variety of applications in which a material is deposited onto a target surface of a work piece. One application is in "circuit edit," a process by which integrated circuits are modified to test wiring changes before creating new photolithography masks to mass produce the circuit. It is known to use an ion beam to sever electrical connections by cutting conductors and to use ion beam-assisted deposition to create new connections. Electrical connections are made between conductors in different conductive layers separated by insulating layers by milling a hole, referred to as a "via," between the conductive layers using the ion beam and filling the hole with a conductive material. The hole may be filled, for example, by ion beam-assisted deposition or electrochemical deposition as described in U.S. Pat. Pub. No. 20050227484 to Gu et al. for a "System for Modifying Small Structures," which is assigned to the assignee of the present invention.

Figure 4:
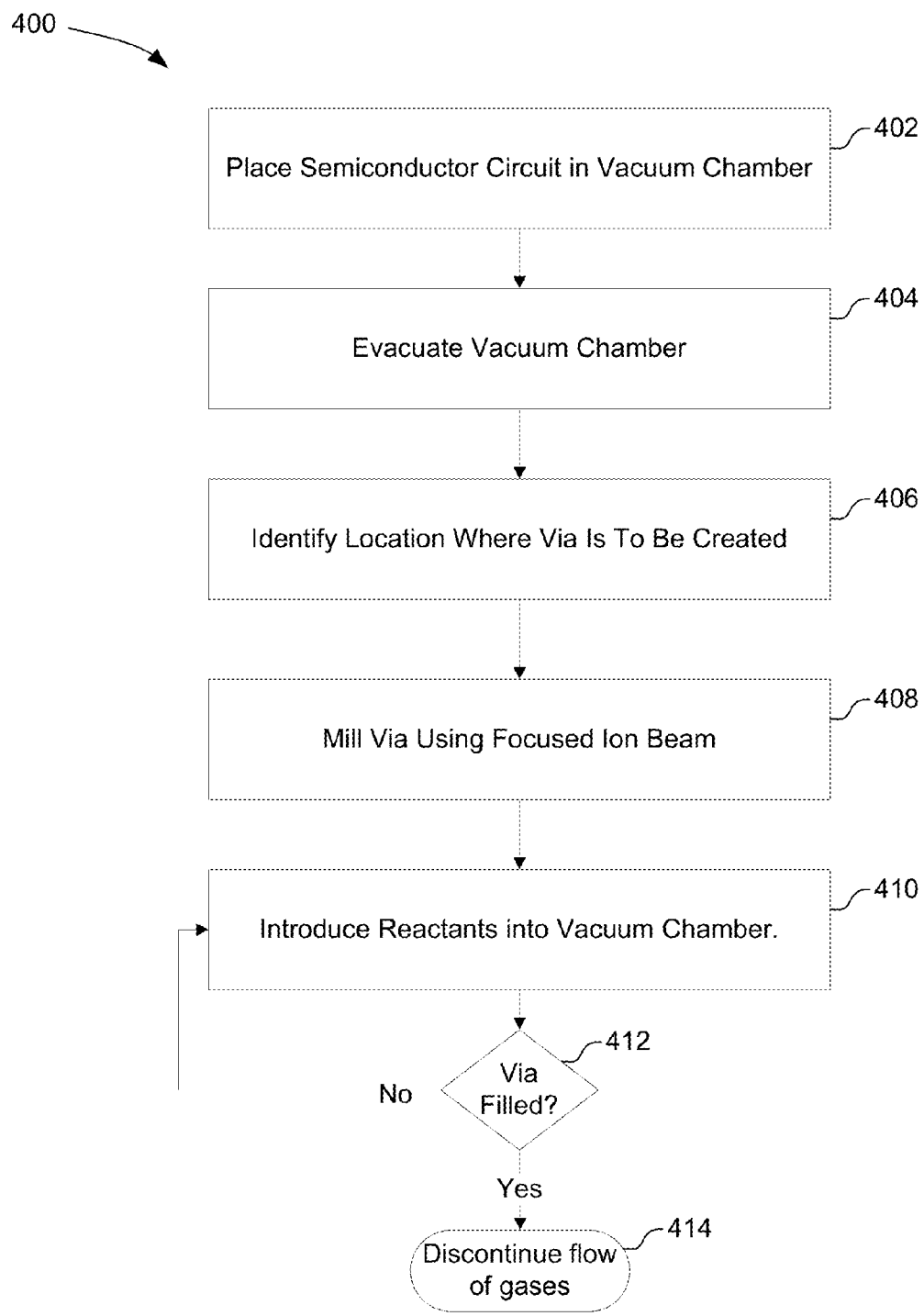
FIG. 4 is a flow chart showing a method of filling a via.

FIG. 4 shows a flow chart 400 a method of filling a via with a conductive material. In step 402, a semiconductor circuit to be modified is placed in a vacuum chamber of a focused ion beam system, preferably a dual beam system having both an ion column and an electron column for use in scanning electron microscopy. In step 404, the sample chamber is evacuated. In step 406, the location at which the via is to be created is identified. The location can be determined, for example, by using surface features visible in an SEM image or focused ion beam image, and comparing the observable features with computer aided design data.

In step 408, the via is milled using the focused ion beam. It is preferable to mill using an etch-enhancing gas, such as $XeF_2$ or iodine, to reduce redeposition of the milled material onto the sidewalls of the hole being milled. In step 410, two reactants, a precursor gas and an activator gas, are introduced into the vacuum chamber. As described above with respect to the right hand column of FIG. 2, the reactants will tend to spontaneously react and deposit a material on regions that were impacted by the ion beam. Because the via was milled using the ion beam, the gases tend to react in the via and deposit material. An advantage of this method is that the film grown by the spontaneous reaction will preferentially nucleate inside the via, filling it before substantial growth begins on the top surface of the work piece. It is preferred to perform steps 408 and 410 in the same vacuum chamber, i.e. that the work piece not be exposed to air between these two steps of milling and reactant introduction; this precaution maximizes the preferential nucleation in the just-made via with respect to the rest of the work piece. An additional precaution would be to perform step 410 within a reasonably short amount of time of step 408, for instance not to exceed a few hours or preferably 30 minutes, for the same reason. In step 412, it is determined whether or not the via has been filled, for example, by observing the via using a scanning electron microscope ("SEM"). If the via is not yet filled, reactants are continued to be introduced into the vacuum chamber. When the via had been filled, the introduction of reactants is stopped in step 414. The concentration of reactants will decrease as gases are exhausted by the vacuum pump, and the reaction will stop when the concentration or partial pressure of one of the reactants is insufficient to sustain the reaction.

Figure 5:
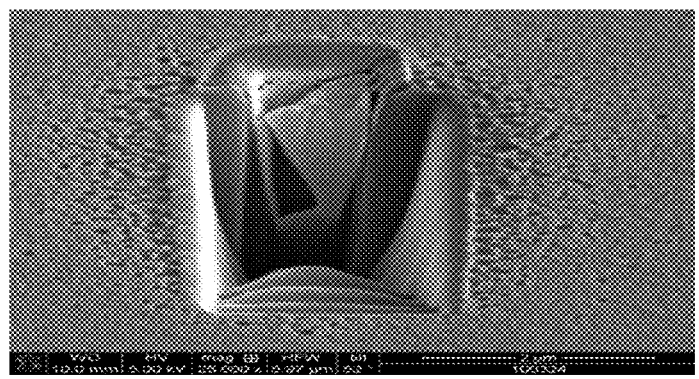
FIG. 5 show a cross section of a via produced by the method of FIG. 4.

FIG. 5 is a photomicrograph of a cross section of a via filled in accordance with the method of FIG. 4 using $Pt(PF_3)_4$ as the precursor gas and $XeF_2$ as the activator gas. Filling a via having a 5:1 aspect ratio is readily achieved using the present invention. Skilled persons will be able to fill holes having aspect ratios of 10:1 or greater using an optimized process. The resistance through these vias has been measured to be in the range 10 to 70 Ohm depending on via size. Resistivity is difficult to reliably measure in this geometry.

Applicants have found that in some embodiments, the resistance of the filled via is greater than the resistance expected of a solid plug of pure platinum, probably because (a) there may be voids in the via as can be seen from the cross-section images; (b) the deposition material is likely in non-dense form and thus has a higher resistivity, and it is difficult to densify the material in the via using the ion beam; (c) the contact resistance at the interface with the existing conductors may be greater than the contact resistance of a conductor deposited by to FIB deposition or FIB sputter deposition, perhaps because there is little or no mixing of materials at the interface.

Another application of the present invention is the deposition of a protective layer to protect a sample during further processing. For example, to prevent changes to a structure while preparing it for observation, it is common to apply a protective layer to the surface of a semiconductor before cutting a cross section for SEM viewing or before cutting out a lamella for viewing on a transmission electron microscope. The protective layer is typically applied by a combination of electron beam-induced deposition and ion beam-induced deposition. Ion beam-induced deposition has a higher deposition rate than electron-beam induced deposition, but the gallium ions implant into the work piece and damage the work piece surface. A two-step process is sometimes used to reduce damage and improve processing speed: a protective layer, such as a platinum layer, is deposited using electron beam-induced deposition, followed by the deposition of a thicker layer using ion beam-induced deposition. The layer deposited by the electron beam serves to protect the area from gallium implantation and damage during the subsequent step of depositing a protective layer with the gallium beam. The low deposition rate of the electron beam-induced deposition and the requirement to use both an ion beam and an electron beam is a drawback to this process.

Figure 6:
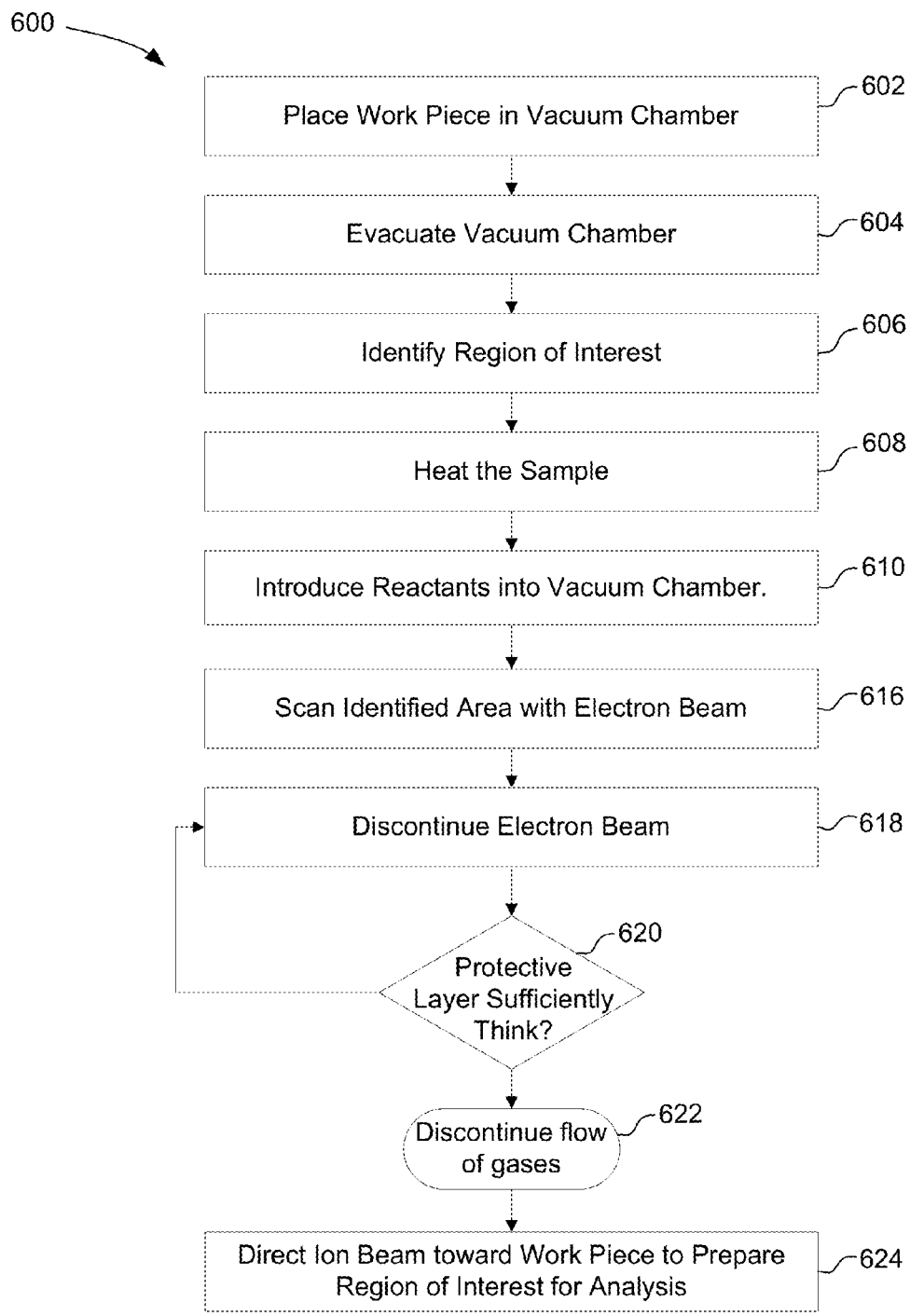
FIG. 6 is a flow chart showing a method of producing a protective layer.

The spontaneous reaction of the present invention allows the rapid deposition of a protective layer over an area of interest without ion beam damage. FIG. 6 shows a flowchart 600 showing the steps of a method of applying a protective layer. In step 602, the work piece is placed in a vacuum chamber of a dual beam system having both an ion column and an electron column. In step 604, the sample chamber is evacuated. In step 606, region of interest is located on the work piece. For example, it may be desirable to observe a vertical cross section at a specified location, and the position of the cross section can be determined using surface features visible in an SEM image or focused ion beam image, and comparing the observable features with computer aided design data.

In step 608, the sample is optionally heated to, for example, 60 degrees to prevent or reduce unwanted deposition by reducing the residence time of gas molecules on the work piece surface. In step 610 reactants are introduced, usually by separate gas injection pathways, into the vacuum chamber near the surface of the work piece. In step 616, an electron beam is optionally scanned over the area identified in step 606. For example, the electron beam may be scanned in such a manner as to observe the reaction proceed. If the electron beam is used for observation then the growth will initiate from a random nucleation point and proceed to grow to a large size. The electron beam may alternatively be used to initiate a spontaneous reaction of the reactants in the scan area. In step 618, if the electron beam was used for nucleation of the growth in a pattern form, it is discontinued, while the reaction continues, catalyzed by the initial deposit; otherwise it may be left on to observe the growth proceed to desired completion. When the protective layer is sufficiently thick, as determined in decision block 620, introduction of the reactants is discontinued in step 622, and the reaction will cease as the concentration of one of the reactants falls below a minimum level. In step 624, an ion beam is directed towards the work piece to prepare a portion of the region of interest for analysis. For example, the ion beam can free a microsample from the work piece, attach the microsample to a TEM sample holder, and thin the sample in preparation for viewing on a transmission electron microscope ("TEM"). Alternatively, the ion beam can mill a groove to expose a cross section for viewing by an SEM.

Figure 7A:
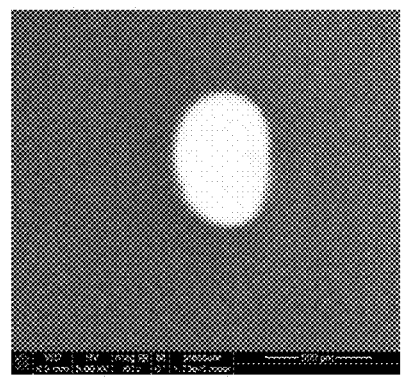
FIG. 7A is a photomicrograph of a protective layer deposited according to the method of FIG. 6.
Figure 7B:
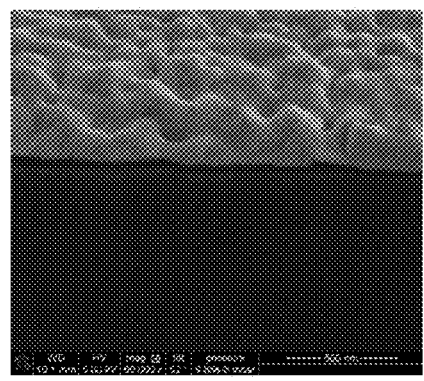
FIG. 7B is a photomicrograph showing a cross section of the protective layer of FIG. 7A.

FIG. 7A shows a top view of a film that was deposited using the method of FIG. 6 using $Pt(PF_3)_4$ as the precursor gas and $XeF_2$ as the activator gas. The layer shown in FIG. 7 was deposited in approximately 90 seconds, has a diameter of hundreds of microns diameter and a thickness of about 200 nm.

In another embodiment, surface conditions are altered by providing an initial patterned film on the surface to initiate or inhibit the spontaneous reaction of the reactants, to deposit a film defined by the initial pattern. For example, the initial film can be produced by beam-induced deposition or by etching a pattern in a masking material by a beam. For example, carbon requires a different ratio of activator to precursor gas in order to nucleate the growth of metal from some precursor-activator combinations, such as $Pt(PF_3)_4$ and $XeF_2$. A pattern can be deposited by providing an initial pattern of carbon on the surface, with the subsequent deposition occurring in regions in which carbon is not present. The carbon mask can later be removed. Carbon can be deposited, for example, by direct writing using an ion or electron beam-induced deposition, for example, using a styrene precursor. Carbon can be deposited by direct writing of carbon using a beam of fullerenes, as described, for example, in U.S. Pat. Publication No. 2008/0142735 for "Charger Portable Beam Processing Using a Cluster Source," which is assigned to the assignee of the present invention. After the carbon is deposited, the work piece is exposed to the reactants, and a pattern is formed by spontaneous deposition in regions where there is no carbon. In another embodiment, carbon or another material can be deposited globally over the work piece surface, and then an electron or ion beam can remove the carbon or other material in a desired pattern before exposure of the work piece to the reactants. An initial pattern could also be created by lithography.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of depositing material onto a work piece in a vacuum chamber of a particle beam system, comprising:
providing within the vacuum chamber a metal-containing precursor gas and a halogen-containing activator gas;
providing a work piece having a surface that does not provide conditions sufficient for reacting the metal-containing precursor gas with the halogen-containing activator gas; and
directing a beam toward a portion of the surface to provide reacting conditions at the portion of the surface, the portion of the surface, initialing a spontaneous deposition reaction between the metal-containing precursor gas and the halogen-containing activator gas present at the portion of the surface, thereby causing deposition of a material onto the portion of the surface, wherein the halogen-containing activator gas decomposes the precursor gas into the material and one or more volatile compounds in the presence of the portion of the surface providing reacting conditions.

2. The method of claim 1 in which the beam is discontinued whilst continuing to provide the metal-containing precursor gas and the halogen-containing activator gas at the surface to continue to deposit material in the absence of the beam at positions at which the deposition was initiated.

3. The method of claim 1 in which the deposition is initiated whilst the work piece is maintained at a temperature of less than 100° C.

4. The method of claim 1 in which directing the beam toward a portion of the surface to provide reacting conditions at the portion of the surface that initiate a spontaneous deposition reaction between the metal-containing precursor gas and the halogen-containing activator gas present at the portion of the surface comprises directing a charged particle beam or a photon beam toward the work piece.

5. The method of claim 1 in which providing a work piece having a surface that does not provide conditions sufficient for reacting the metal-containing precursor gas with the halogen-containing activator gas further comprises heating the work piece above room temperature.

6. A method of depositing material onto a work piece, comprising:

directing a beam toward a work piece positioned within a vacuum chamber to prepare a work piece surface that includes first regions that support the initiation of a spontaneous deposition reaction between a precursor gas comprising an inorganic compound with metal ligands and a halogen-containing activator gas and second regions that do not support the initiation of the spontaneous deposition reaction; and providing the precursor gas and the activator gas at the work piece surface such that the precursor gas and the activator gas adsorb onto the first regions and spontaneously react with each other to deposit a metal at the first regions to selectively deposit metal in a pattern onto the work piece surface, wherein the halogen-containing activator gas decomposes the precursor gas into the metal and one or more volatile compounds in the presence of the first regions that support the initiation of the spontaneous deposition reaction.

7. The method of claim 6 in which the spontaneous deposition reaction continues in the absence of directing the beam toward the work piece.

8. The method of claim 6 in which the deposition is initiated at room temperature.

9. The method of claim 6 in which the deposition is initiated whilst the work piece is maintained at a temperature of less than 200° C.

10. The method of claim 7 in which the material that is spontaneously deposited supports subsequent spontaneous deposition.

11. The method of claim 10 in which the deposition is stopped by decreasing the concentration or partial pressure of either one of the precursor gas and the halogen-containing activator gas at the work piece surface.

12. The method of claim 6 further comprising directing an ion beam toward the deposited material to increase the density of the material.

13. The method of claim 6 in which directing the beam toward a work piece to prepare a work piece surface that includes first regions that support the initiation of a spontaneous deposition reaction between a metal-containing precursor gas and a halogen-containing activator gas and second regions that do not support the initiation of the spontaneous deposition reaction includes directing an electron beam toward the work piece while providing at the work piece surface the metal-containing precursor gas and the halogen-containing activator gas.

14. The method of claim 6 in which directing the beam toward a work piece to prepare a work piece surface that includes first regions that support the initiation of a spontaneous deposition reaction between a metal-containing precursor gas and a halogen-containing activator gas and portions that do not support the initiation of the spontaneous deposition reaction includes directing an ion beam toward the work piece before providing at the work piece surface the metal-containing precursor gas and the halogen-containing activator gas.

15. The method of claim 6 in which directing the beam toward a work piece to prepare a work piece surface that includes first regions that support the initiation of a spontaneous deposition reaction between a metal-containing precursor gas and a halogen-containing activator gas and second regions that do not support the initiation of the spontaneous deposition reaction includes directing a photon beam toward the work piece before providing at the work piece surface the metal-containing precursor gas and the halogen-containing activator gas.

16. The method of claim 6 in which directing the beam toward a work piece to prepare a work piece surface that includes first regions that support the initiation of a spontaneous deposition reaction between a metal-containing precursor gas and a halogen-containing activator gas and second regions that do not support the initiation of the spontaneous deposition reaction includes directing the beam to deposit an initial layer onto the work piece, the initial layer supporting the initiation of the spontaneous deposition reaction.

17. The method of claim 6 in which directing the beam toward a work piece to prepare a work piece surface that includes first regions that support the initiation of a spontaneous deposition reaction between a metal-containing precursor gas and a halogen-containing activator gas and second regions that do not support the initiation of the spontaneous deposition reaction includes directing the beam to deposit an initial layer onto the work piece, the initial layer inhibiting the initiation of the spontaneous deposition reaction.

18. The method of claim 6 in which the work piece is maintained at a temperature below a temperature of the walls of the vacuum chamber to cause the precursor gas and the halogen-containing activator gas to preferentially react on the surface of the first regions of the work piece.

19. The method of claim 6 further comprising stopping the spontaneous deposition reaction by reducing a partial pressure of the precursor gas or the halogen-containing activator gas.

20. The method of claim 6 in which the material deposited has a resistivity of less than 2000 micro ohm-cm.

21. The method of claim 20 in which the material deposited has a resistivity of less than 100 micro ohm-cm.

* * * * *